(12) United States Patent
Chen

(10) Patent No.: US 9,979,138 B1
(45) Date of Patent: May 22, 2018

(54) USB FUNCTION-TYPE MAGNETIC CABLE

(71) Applicant: DONGGUAN CITY JIANGHAN ELECTRONICS CO., LTD, Guangdong (CN)

(72) Inventor: Wei Xi Chen, Guangdong (CN)

( * ) Notice: Subject to any disclaimer, the term of this patent is extended or adjusted under 35 U.S.C. 154(b) by 0 days. days.

(21) Appl. No.: 15/649,660

(22) Filed: Jul. 14, 2017

(30) Foreign Application Priority Data

Jun. 8, 2017 (CN) .......................... 2017 1 0426615

(51) Int. Cl.
| | |
|---|---|
| *H01R 11/30* | (2006.01) |
| *H01R 13/66* | (2006.01) |
| *H01R 13/62* | (2006.01) |
| *H01R 24/60* | (2011.01) |
| *G01K 7/24* | (2006.01) |
| *G01K 3/00* | (2006.01) |
| *G01R 19/165* | (2006.01) |
| *H01R 107/00* | (2006.01) |

(52) U.S. Cl.
CPC ......... *H01R 13/6683* (2013.01); *G01K 3/005* (2013.01); *G01K 7/24* (2013.01); *G01R 19/165* (2013.01); *H01R 13/6205* (2013.01); *H01R 24/60* (2013.01); *H01R 2107/00* (2013.01)

(58) Field of Classification Search
CPC ............ H01R 13/6683; H01R 2107/00; H01R 13/6205; H01R 24/60; H04W 88/02; G01K 7/24; G01K 3/005; G01R 19/165
USPC .......................................................... 439/39
See application file for complete search history.

(56) References Cited

U.S. PATENT DOCUMENTS

| | | | | |
|---|---|---|---|---|
| 8,827,899 B2* | 9/2014 | Farr | ................... | A61B 1/00052 600/188 |
| 8,858,425 B2* | 10/2014 | Farr | ................... | A61B 1/00103 600/109 |
| 9,019,698 B2* | 4/2015 | Thiers | ................... | H04W 88/02 248/922 |
| 9,737,891 B2* | 8/2017 | TerMaat | ................... | B01L 7/52 |

* cited by examiner

*Primary Examiner* — Jean F Duverne
(74) *Attorney, Agent, or Firm* — Prakash Nama; Global IP Services, PLLC

(57) ABSTRACT

The disclosure relates to a USB function-type magnetic cable, comprising a USB cable main body and a USB moveable plug; an end B of the USB cable main body is in moveable connection with the USB moveable plug; an end A of the USB cable main body is in connection with a computer or charger, the end B of the USB cable main body is in connection with a mobile device through the USB moveable plug; the end B of the USB cable main body comprises a first PCB board, and the first PCB board is configured to output a control signal to cut off a power supply circuit when detecting a temperature abnormity of the USB moveable plug or a supply voltage abnormity.

9 Claims, 4 Drawing Sheets

USB FUNCTION-TYPE MAGNETIC CABLE

BACKGROUND OF THE INVENTION

The disclosure relates to the field of the technologies of USB function-type data magnetic cables, and in particular to a USB function-type magnetic cable.

USB data cables are used to connect mobile devices and computers to achieve the purpose of data transmission or communication. Generally, USB data cables are path tools connecting computers and mobile devices to transmit files such as video, ringtone and image. USB data cables also may be used for the charging and external connection of mobile phones. At present, with the rapid development of electronic industries, USB function-type magnetic cables have become one indispensable part of our lives.

Current USB function-type magnetic cables have main functions no more than data/electricity transmission and realizing connection with and use of device interfaces, but cannot realize protection for the USB function-type magnetic cables, devices and interfaces.

BRIEF SUMMARY OF THE INVENTION

In view of this, it is necessary to provide a USB function-type magnetic cable aiming at the problem that protection cannot be realized for USB function-type magnetic cables, devices and interfaces.

A USB function-type magnetic cable includes a USB cable main body and a USB moveable plug; an end B of the USB cable main body is in moveable connection with the USB moveable plug; an end A of the USB cable main body is in connection with a computer or charger, the end B of the USB cable main body is in connection with a mobile device through the USB moveable plug; the end B of the USB cable main body includes a first PCB board; and the first PCB board is configured to output a control signal to cut off a power supply circuit when detecting a temperature abnormity of the USB moveable plug or a supply voltage abnormity.

Preferably, the first PCB board includes a USB master control chip, a field-effect transistor, a thermistor, a power input interface and a power output interface; one end of the thermistor is in connection with an input end of the USB master control chip, an output end of the USB master control chip is in connection with a grid electrode of the field-effect transistor, a source electrode of the field-effect transistor is in connection with the power input interface, a drain electrode of the field-effect transistor is in connection with one end of the power output interface.

Preferably, the first PCB board further includes a first resistor, a second resistor, a third resistor, a fourth resistor, a first capacitor and a second capacitor; the field-effect transistor includes a first field-effect transistor and a second field-effect transistor; the output end of the USB master control chip is in connection with a grid electrode of the first field-effect transistor and a grid electrode of the second field-effect transistor through the second resistor, the power input interface is also in connection with the grid electrode of the first field-effect transistor and the grid electrode of the second field-effect transistor through the third resistor, the input end of the USB master control chip is also grounded through the first capacitor and the first resistor in turn, one end of the thermistor is also grounded through the fourth resistor, a drain electrode of the first field-effect transistor and a drain electrode of the second field-effect transistor are also grounded through the second capacitor.

Preferably, the end B of the USB cable main body further includes a first metal shell, a first plastic molding head, a plastic cement locating element, a first neodymium-iron-boron magnet and a pogo pin; the first plastic molding head is integrally molded on the end B of the USB cable main body, one end of the pogo pin is welded with the first PCB board; the first PCB board, the first plastic molding head, the plastic cement locating element, the first neodymium-iron-boron magnet and the first metal shell are fixedly mounted in turn from the inside out.

Preferably, the end A of the USB cable main body includes a USB A male plug, a second metal shell and a second plastic molding head; the second plastic molding head is integrally molded on the end A of the USB cable main body; and the USB A male plug, the second plastic molding head and the second metal shell are fixedly mounted in turn from the inside out.

Preferably, the USB moveable plug includes a connector colloid body, a pin assembly, a connector metal body, a second neodymium-iron-boron magnet, an exposed colloid body, an exposed metal shell, an exposed metal sheet and a second PCB board; when the end B of the USB cable main body is in moveable connection with the USB moveable plug, the exposed metal shell and the second neodymium-iron-boron magnet are in magnetic attraction with the end B of the USB cable main body; the pin assembly is in connection with the end B of the USB function-type magnetic cable, the second PCB board is welded with the pin assembly; and the pin assembly, the connector colloid body, the connector metal body, the exposed colloid body, the second neodymium-iron-boron magnet, the exposed metal shell and the exposed metal sheet are fixedly mounted in turn from the inside out.

Preferably, the pin point of the pin assembly is concaved into the moveable plug.

Preferably, the USB moveable plug is any one of the group consisting of a Micro USB moveable plug, a Lightning connector moveable plug and a Type C moveable plug.

Preferably, the end B of the USB cable main body and the USB moveable plug are connected by automatic attraction.

Preferably, the end B of the USB cable main body and the USB moveable plug are in blind-mate connection regardless of front and back sides.

Compared with existing technologies, the disclosure has benefits as follows.

1. The end B of the USB cable main body in connection with the mobile device through the USB moveable plug can transmit data to/from or electricity to the mobile device; the end B of the USB cable main body is provided with the first PCB board; the first PCB board is configured to detect a temperature abnormity of the USB moveable plug or a supply voltage abnormity; when detecting an abnormal increase in the heating of the USB moveable plug or a supply voltage abnormity (voltage is too low), the first PCB board outputs a control signal to cut off the power supply circuit, preventing the USB function-type magnetic cable itself, the mobile device from heating or combusting, thereby realizing protection for the USB function-type magnetic cable, the device and interfaces.

2. The USB moveable plug and the end B of the USB function-type magnetic cable may be connected by automatic attraction, and realize blind-mate connection to enable data/electricity connection regardless of front and back sides; the usage is convenient and quick.

3. The pin point of the pin assembly is concaved into the moveable plug; in practical use, hands and metal objects are not easy to contact the pin point, thereby not leading to short circuit between pin points, or peripheral damage caused by static electric shock, and being beneficial for prolonging the service life of the USB moveable plug and the mobile device.

4. The USB moveable plug is any one of the group consisting of a Micro USB moveable plug, a Lightning connector moveable plug and a Type C moveable plug; these three types of moveable plugs are connected with different mobile devices correspondingly, so that the USB function-type magnetic cable has a flexible and wide usage.

DETAILED DESCRIPTION OF THE INVENTION

The purpose, the technical scheme and the advantages of the disclosure will become more clearly understood from the clear and complete description of the technical scheme of the embodiment of the disclosure below taken in conjunction with accompanying drawings in the disclosure. Obviously, the embodiments described hereinafter are simply part embodiments of the disclosure, but all the embodiments. All other embodiments obtained by those skilled in the art based on the embodiments in the disclosure without creative work are intended to be included in the scope of protection of the disclosure.

Figure 1:
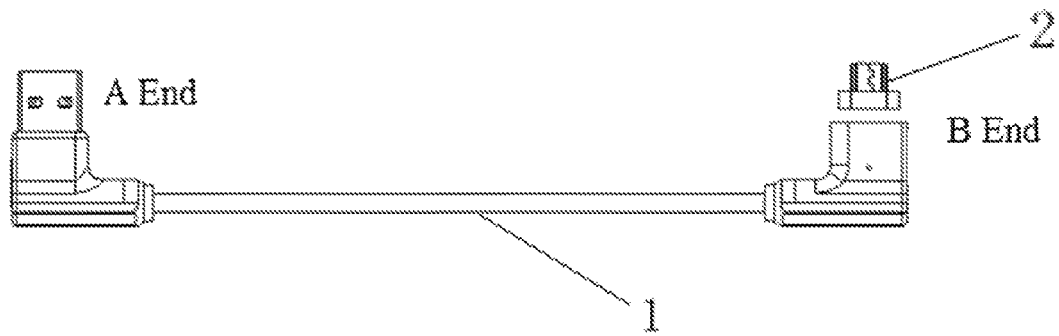
FIG. 1 a schematic structure diagram of a USB function-type magnetic cable of an embodiment.
Figure 2:
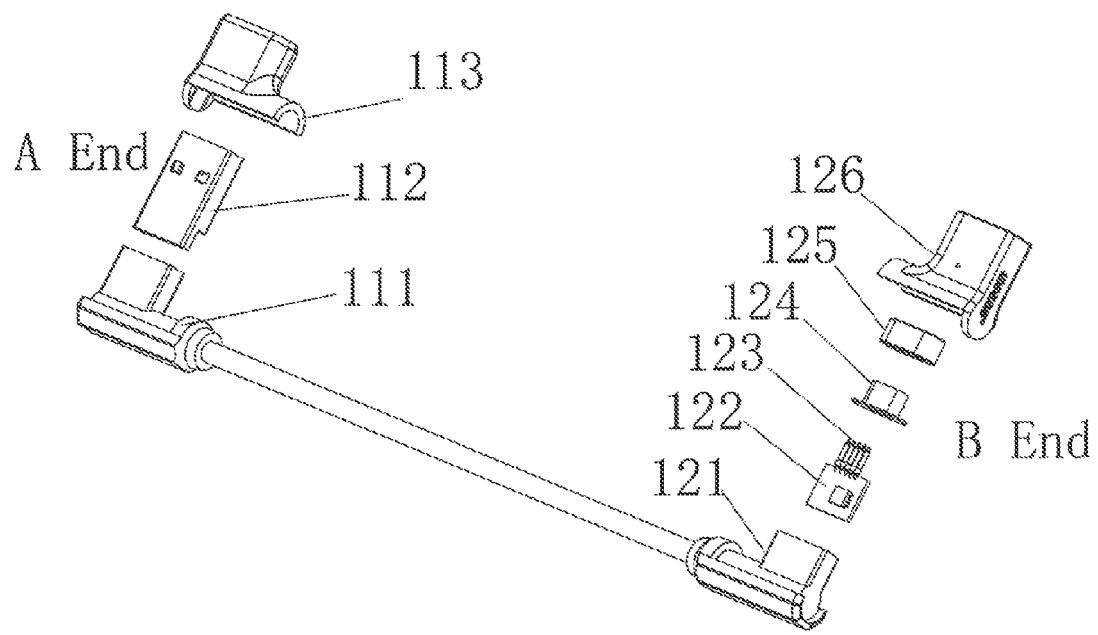
FIG. 2 is an exploded view of a USB cable main body of the USB function-type magnetic cable of the embodiment of FIG. 1.

FIG. 1 a schematic structure diagram of a USB function-type magnetic cable of an embodiment. FIG. 2 is an exploded view of a USB cable main body of the USB function-type magnetic cable of the embodiment of FIG. 1. In conjunction with FIG. 2, as shown in FIG. 1, a USB function-type magnetic cable includes a USB cable main body 1 and a USB moveable plug 2; an end B of the USB cable main body 1 is in moveable connection with the USB moveable plug 2; an end A of the USB cable main body 1 is in connection with a computer or charger, the end B of the USB cable main body 1 is in connection with a mobile device through the USB moveable plug 2; the end B of the USB cable main body 1 includes a first PCB board 122; and the first PCB board 122 is configured to output a control signal to cut off a power supply circuit when detecting a temperature abnormity of the USB moveable plug or a supply voltage abnormity.

As shown in FIG. 2, the end B of the USB cable main body 1 further includes a first metal shell 126, a first plastic molding head 121, a plastic cement locating element 124, a first neodymium-iron-boron magnet 125 and a pogo pin 123; the first plastic molding head 121 is integrally molded on the end B of the USB cable main body 1, one end of the pogo pin 123 is welded with the first PCB board 122; the first PCB board 122, the first plastic molding head 121, the plastic cement locating element 124, the first neodymium-iron-boron magnet 125 and the first metal shell 126 are fixedly mounted in turn from the inside out.

Herein, the first neodymium-iron-boron magnet 125 and the USB moveable plug 2 can attract each other, and the pogo pin 123 is in connection with the pin point on the USB moveable plug 2 to transmit data to/from or electricity to a device.

As shown in FIG. 2, the end A of the USB cable main body 1 includes a USB A male plug 112, a second metal shell 113 and a second plastic molding head 111; the second plastic molding head is integrally molded on the end A of the USB cable main body 1; and the USB A male plug 112, the second plastic molding head 111 and the second metal shell 113 are fixedly mounted in turn from the inside out.

Figure 3:
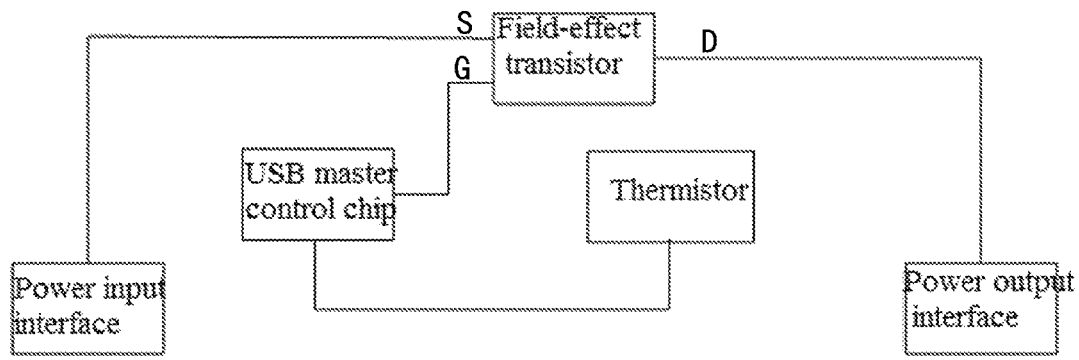
FIG. 3 is a circuit block diagram of a first PCB board of the USB function-type magnetic cable of the embodiment of FIG. 1.

FIG. 3 is a circuit block diagram of a first PCB board of the USB function-type magnetic cable of the embodiment of FIG. 1. As shown in FIG. 3, the first PCB board 122 includes a USB master control chip 32, a field-effect transistor 33, a thermistor 34, a power input interface 31 and a power output interface 35; one end of the thermistor 34 is in connection with an input end of the USB master control chip 32. An output end of the USB master control chip 32 is in connection with a grid electrode (G) of the field-effect transistor 33, a source electrode (S) of the field-effect transistor is in connection with the power input interface 31, and a drain electrode (D) of the field-effect transistor is in connection with one end of the power output interface 35. When the thermistor 34 detects a heating abnormality (temperature rise) of the USB moveable plug or a supply voltage abnormity (voltage is too low), the USB master control chip 32 outputs a control signal to turn off the field-effect transistor 33 in the circuit, thereby cutting off the power supply circuit, preventing the USB function-type magnetic cable itself, the mobile device from heating or combusting, and realizing protection for the USB function-type magnetic cable, the device and interfaces.

Figure 4:
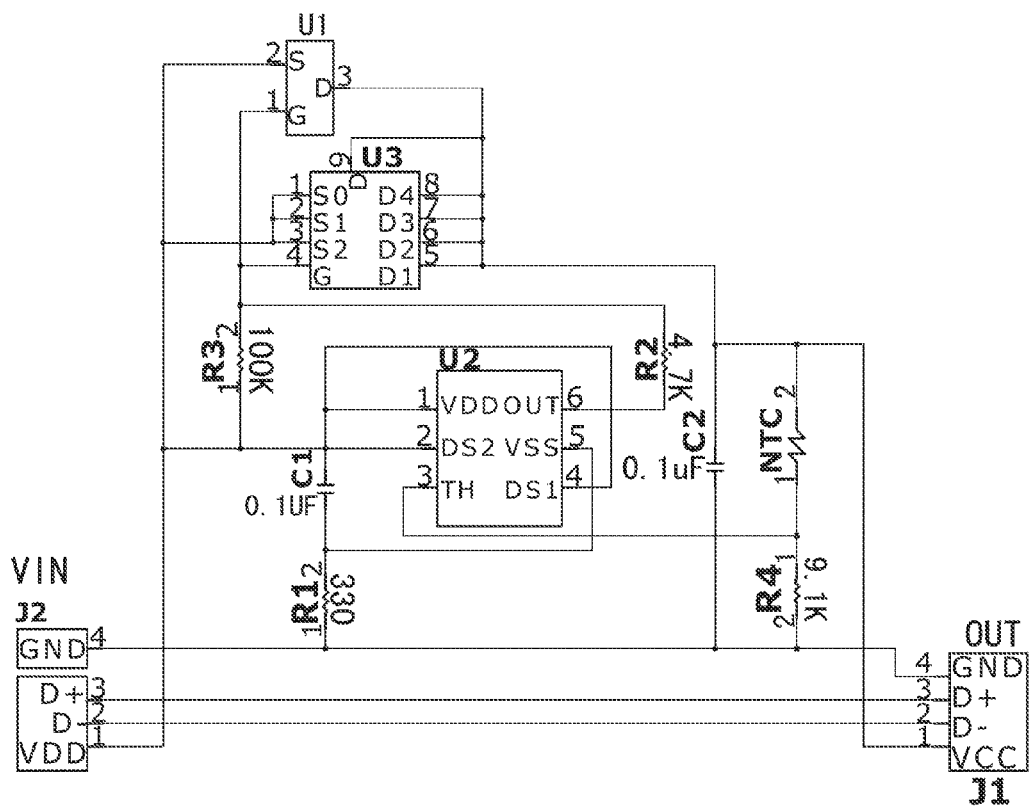
FIG. 4 is a schematic circuit diagram of the first PCB board of the USB function-type magnetic cable of the embodiment of FIG. 1.

FIG. 4 is a schematic circuit diagram of the first PCB board of the USB function-type magnetic cable of the embodiment of FIG. 1. As shown in FIG. 4, the first PCB board further includes a first resistor (R1), a second resistor (R2), a third resistor (R3), a fourth resistor (R4), a first capacitor (C) and a second capacitor (C2); the field-effect transistor 33 includes a first field-effect transistor (U1) and a second field-effect transistor (U3); the output end of the USB master control chip (U2) is in connection with a grid electrode of the first field-effect transistor (U1) and a grid electrode of the second field-effect transistor (U3) through the second resistor (R2), the power input interface (VIN) is also in connection with the grid electrode of the first field-effect transistor (U1) and the grid electrode of the second field-effect transistor (U3) through the third resistor (R3), the input end of the USB master control chip (U2) is also grounded through the first capacitor (C1) and the first resistor (R1) in turn, one end of the thermistor (NTC) is also grounded through the fourth resistor (R4), a drain electrode of the first field-effect transistor (U1) and a drain electrode of the second field-effect transistor (U3) are also grounded through the second capacitor (C2).

Figure 5:
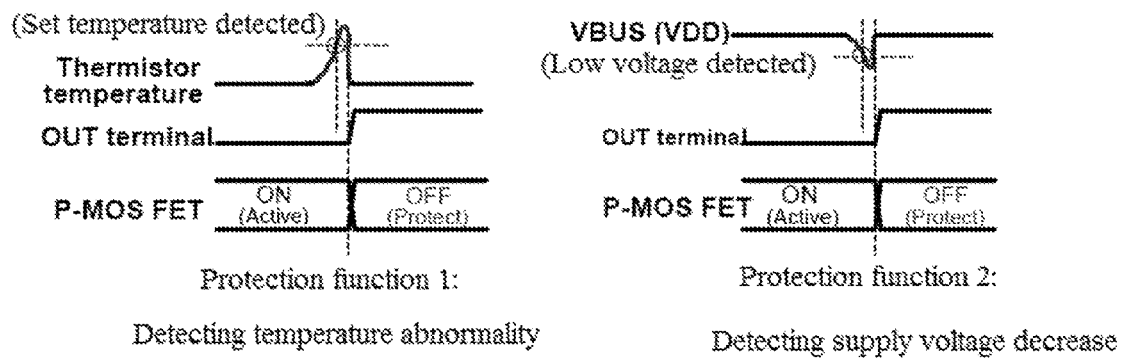
FIG. 5 is a signal diagram when an abnormality is detected by the first PCB board of the USB function-type magnetic cable of the embodiment of FIG. 1.

Specifically, FIG. 5 is a signal diagram when an abnormality is detected by a control circuit of the first PCB board 122 of the USB function-type magnetic cable of the embodiment of FIG. 1. Temperature is preset to 70 degrees through the R4, the NTC (thermistor) conducts temperature detection for the USB function-type magnetic cable, FIG. 5 Left shows a signal diagram of the temperature abnormality of the USB function-type magnetic cable itself detected through the peripheral thermistor 34, and FIG. 5 Right shows a signal diagram of the supply voltage decrease caused by an abnormality of a charging terminal. When an abnormality occurs, power supply must be switched on again to activate the USB master control chip (plug off the USB function-type magnetic cable itself at the input end and plug in again), so as to eliminate the abnormal state and recover to normal state.

Figure 6:
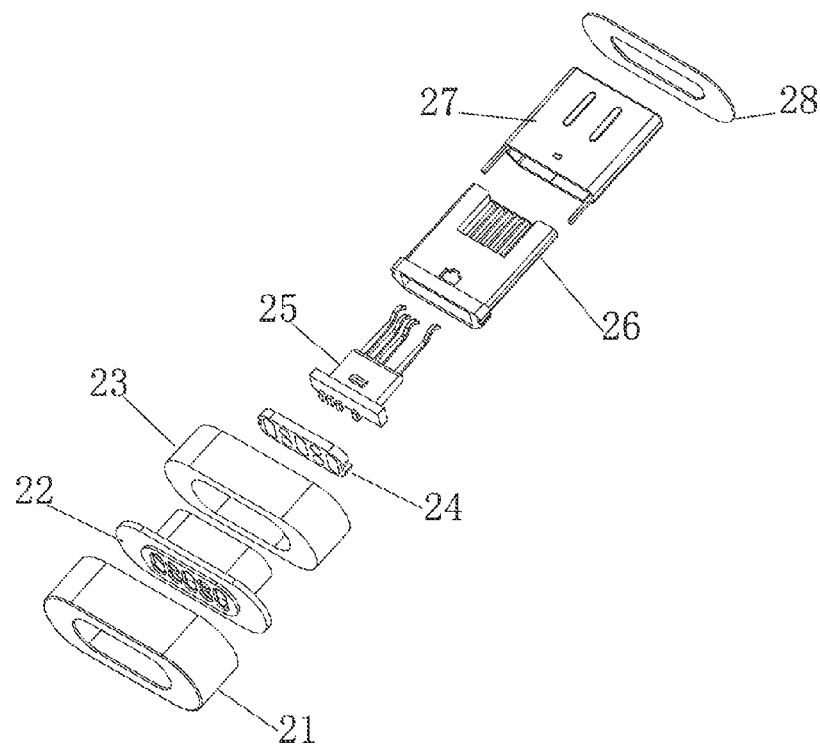
FIG. 6 is an exploded view of a USB moveable plug of the USB function-type magnetic cable of the embodiment of FIG. 1.

FIG. 6 is an exploded view of a USB moveable plug of the USB function-type magnetic cable of the embodiment of FIG. 1. As shown in FIG. 6, the USB moveable plug 2 includes a connector colloid body 26, a pin assembly 25, a connector metal body 27, a second neodymium-iron-boron magnet 23, an exposed colloid body 22, an exposed metal shell 21, an exposed metal sheet 28 and a second PCB board 24; when the end B of the USB cable main body is in moveable connection with the USB moveable plug, the exposed metal shell 21 and the second neodymium-iron-boron magnet 23 are in magnetic attraction with the end B of the USB cable main body; the pin assembly 25 is in connection with the end B of the USB function-type magnetic cable, the second PCB board 24 is welded with the pin assembly 25; and the pin assembly 25, the connector colloid body 26, the connector metal body 27, the exposed colloid body 22, the second neodymium-iron-boron magnet 23, the exposed metal shell 21 and the exposed metal sheet 28 are fixedly mounted in turn from the inside out.

As a preferred embodiment, a control circuit is provided on the second PCB board 24.

As a preferred embodiment, the pin point of the pin assembly 25 is concaved into the moveable plug 2. The pin point is in connection with the end B of the USB function-type magnetic cable to transmit data to/from or electricity to a device; the USB moveable plug 2 may be always inserted into a mobile device, thereby avoiding frequency plug in/plug off when charging or data connecting the mobile device, so that the mobile device's interface is protected, dustproof and waterproof effects are achieved and the service life of the peripheral interface is prolonged; moreover, the exposed pin point of the USB moveable plug 2 is concaved into the moveable plug body; in practical use, hands and metal objects are not easy to contact the pin point, thereby not easily leading to short circuit between pin points, or peripheral damage caused by static electric shock, and being beneficial for prolonging the service life of the USB moveable plug and the peripheral.

Figure 7:
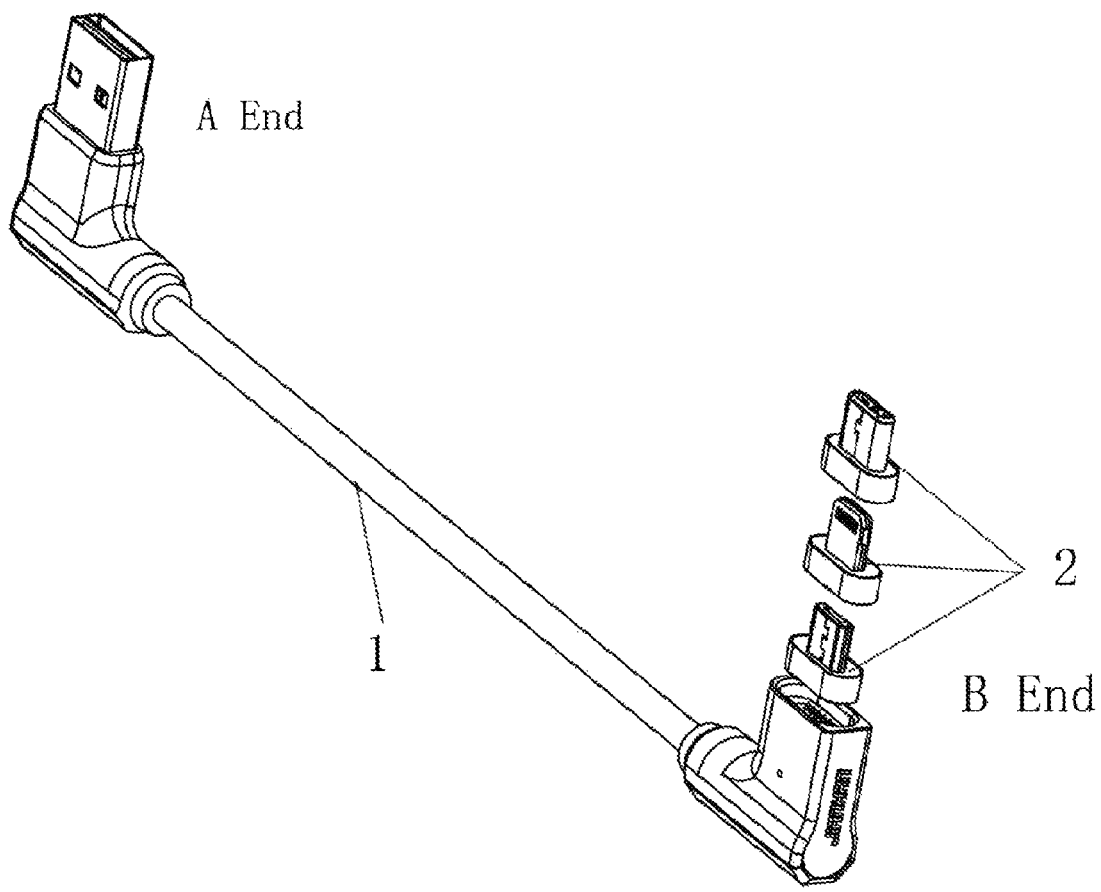
FIG. 7 is a schematic structure diagram of a USB function-type magnetic cable of another embodiment.

FIG. 7 is a schematic structure diagram of a USB function-type magnetic cable of another embodiment. As shown in FIG. 7, the USB moveable plug is any one of the group consisting of a Micro USB moveable plug, a Lightning connector moveable plug and a Type C moveable plug. The Micro USB plug, the Lightning connector plug and the Type C plug mainly are connected to mobile phones, PADs, digital cameras and so on respectively, so that the USB function-type magnetic cable has a flexible and wide usage.

As a preferred embodiment, the end B of the USB cable main body 1 and the USB moveable plug 2 are in blind-mate connection regardless of front and back sides.

As a preferred embodiment, the end B of the USB cable main body 1 and the USB moveable plug 2 are connected by automatic attraction, the usage is more convenient and quicker. Blind-mate connection regardless of front and back sides refers that the data cable B end and the moveable USB plug are connected regardless of front and back sides and can attract each other automatically.

The USB function-type magnetic cable of this technical scheme has benefits as follows.

1. The end B of the USB cable main body in connection with the mobile device through the USB moveable plug can transmit data to/from or electricity to the mobile device; the end B of the USB cable main body is provided with the first PCB board; the first PCB board is configured to detect a temperature abnormality of the USB moveable plug or a supply voltage abnormity; when detecting an abnormal increase in the heating of the USB moveable plug or a supply voltage abnormity (voltage is too low), the first PCB board outputs a control signal to cut off the power supply circuit, preventing the USB function-type magnetic cable itself, the mobile device from heating or combusting, thereby realizing protection for the USB function-type magnetic cable, the device and interfaces.

2. The USB moveable plug and the end B of the USB function-type magnetic cable may be connected by automatic attraction, and realize blind-mate connection to enable data/electricity connection regardless of front and back sides; the usage is convenient and quick.

3. The pin point of the pin assembly is concaved into the moveable plug; in practical use, hands and metal objects are not easy to contact the pin point, thereby not leading to short circuit between pin points, or peripheral damage caused by static electric shock, and being beneficial for prolonging the service life of the USB moveable plug and the mobile device.

4. The USB moveable plug is any one of the group consisting of a Micro USB moveable plug, a Lightning connector moveable plug and a Type C moveable plug; these three types of moveable plugs are connected with different mobile devices correspondingly, so that the USB function-type magnetic cable has a flexible and wide usage.

Each technical feature of the above embodiments may be combined arbitrarily; for concise description, all possible combinations of each technical feature of the above embodiments are not described; however, only if the combination of these technical features has no conflict, it should be considered to be included in the scope of the description of the disclosure.

The above embodiments merely illustrate several implementations of the disclosure, with specific and detailed description, however, they cannot be considered as a limit to the scope of this patent. It should be noted that, for the ordinary staff in this art, multiple deformations and improvements may be made without departing from the idea of the disclosure, and these deformations and improvements belong to the scope of protection of the disclosure. Therefore, the protection scope of the disclosure should be based on claims appended herein.

What is claimed is:

1. A USB function-type magnetic cable, characterized in that: the USB function-type magnetic cable comprises a USB cable main body and a USB moveable plug;
  an end B of the USB cable main body is in moveable connection with the USB moveable plug;
  an end A of the USB cable main body is in connection with a computer or charger, the end B of the USB cable main body is in connection with a mobile device through the USB moveable plug;
  the end B of the USB cable main body comprises a first PCB board; and the first PCB board is configured to output a control signal to cut off a power supply circuit when detecting a temperature abnormity of the USB moveable plug or a supply voltage abnormity;

the first PCB board comprises a USB master control chip, a field-effect transistor, a thermistor, a power input interface and a power output interface;

one end of the thermistor is in connection with an input end of the USB master control chip, an output end of the USB master control chip is in connection with a odd electrode of the field-effect transistor, a source electrode of the field-effect transistor is in connection with the power input interface, a drain electrode of the field-effect transistor is in connection with one end of the power output interface.

2. The USB function-type magnetic cable according to claim 1, characterized in that: the first PCB board further comprises a first resistor, a second resistor, a third resistor, a fourth resistor, a first capacitor and a second capacitor;

the field-effect transistor comprises a first field-effect transistor and a second field-effect transistor;

the output end of the USB master control chip is in connection with a grid electrode of the first field-effect transistor and a grid electrode of the second field-effect transistor through the second resistor, the power input interface is also in connection with the grid electrode of the first field-effect transistor and the grid electrode of the second field-effect transistor through the third resistor, the input end of the USB master control chip is also grounded through the first capacitor and the first resistor in turn, one end of the thermistor is also grounded through the fourth resistor, a drain electrode of the first field-effect transistor and a drain electrode of the second field-effect transistor are also grounded through the second capacitor.

3. The USB function-type magnetic cable according to claim 1, characterized in that: the end B of the USB cable main body further comprises a first metal shell, a first plastic molding head, a plastic cement locating element, a first neodymium-iron-boron magnet and a pogo pin;

the first plastic molding head is integrally molded on the end B of the USB cable main body, one end of the pogo pin is welded with the first PCB board; and the first PCB board, the first plastic molding head, the plastic cement locating element, the first neodymium-iron-boron magnet and the first metal shell are fixedly mounted in turn from the inside out.

4. The USB function-type magnetic cable according to claim 1, characterized in that: the end A of the USB cable main body comprises a USB A male plug, a second metal shell and a second plastic molding head;

the second plastic molding head is integrally molded on the end A of the USB cable main body;

and the USB A male plug, the second plastic molding head and the second metal shell are fixedly mounted in turn from the inside out.

5. The USB function-type magnetic cable according to claim 1, characterized in that: the USB moveable plug comprises a connector colloid body, a pin assembly, a connector metal body, a second neodymium-iron-boron magnet, an exposed colloid body, an exposed metal shell, an exposed metal sheet and a second PCB board;

when the end B of the USB cable main body is in moveable connection with the USB moveable plug, the exposed metal shell and the second neodymium-iron-boron magnet are in magnetic attraction with the end B of the USB cable main body; the pin assembly is in connection with the end B of the USB function-type magnetic cable, the second PCB board is welded with the pin assembly; and the pin assembly, the connector colloid body, the connector metal body, the exposed colloid body, the second neodymium-iron-boron magnet, the exposed metal shell and the exposed metal sheet are fixedly mounted in turn from the inside out.

6. The USB function-type magnetic cable according to claim 5, characterized in that: the pin point of the pin assembly is concaved into the moveable plug.

7. The USB function-type magnetic cable according to claim 1, characterized in that: the USB moveable plug is any one of the group consisting of a Micro USB moveable plug, a Lightning connector moveable plug and a Type C moveable plug.

8. The USB function-type magnetic cable according to claim 1, characterized in that: the end B of the USB cable main body and the USB moveable plug are connected by automatic attraction.

9. The USB function-type magnetic cable according to claim 8, characterized in that: the end B of the USB cable main body and the USB moveable plug are in blind-mate connection regardless of front and back sides.

\* \* \* \* \*